United States Patent
Fagan et al.

(10) Patent No.: US 10,580,666 B2
(45) Date of Patent: Mar. 3, 2020

(54) CARRIER SUBSTRATES FOR SEMICONDUCTOR PROCESSING

(71) Applicant: CORNING INCORPORATED, Corning, NY (US)

(72) Inventors: Sumalee Likitvanichkul Fagan, Painted Post, NY (US); Weiguo Miao, Horseheads, NY (US); Eric James Nichols, Corning, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 15/632,886

(22) Filed: Jun. 26, 2017

(65) Prior Publication Data
US 2018/0005847 A1 Jan. 4, 2018

Related U.S. Application Data

(60) Provisional application No. 62/357,520, filed on Jul. 1, 2016.

(51) Int. Cl.
*H01L 21/56* (2006.01)
*H01L 21/687* (2006.01)
(Continued)

(52) U.S. Cl.
CPC .......... *H01L 21/563* (2013.01); *B29C 66/73* (2013.01); *B29C 70/72* (2013.01);
(Continued)

(58) Field of Classification Search
CPC ..... B32B 9/005; B32B 18/00; H01L 27/0924; H01L 21/823821; H01L 21/563; H01L 27/0928; H01L 29/0649; H01L 29/165
See application file for complete search history.

(56) References Cited

U.S. PATENT DOCUMENTS 4,965,589 A * 10/1990 Takeuchi ................ B41J 2/395
257/E23.042
5,831,309 A * 11/1998 Englisch ............. H01L 21/2007
257/347
(Continued)

FOREIGN PATENT DOCUMENTS

CN 102634850 A 8/2012
CN 105084749 A 11/2015
(Continued)

OTHER PUBLICATIONS

Feng et al. "Optical properties of transparent Pr:YSAG ceramic" Ceramics International 35(1) pp. 427-431.
(Continued)

*Primary Examiner* — Tucker J Wright
(74) *Attorney, Agent, or Firm* — Amy T. Lang; John P. McGroarty

(57) ABSTRACT

A carrier substrate includes a base layer having a first surface, and having a second surface that is parallel to and opposite of the first surface. The carrier substrate further includes a glass layer bonded to the first surface of the base layer. The carrier substrate has a Young's modulus greater than or equal to 150 GPa. A carrier substrate includes a polycrystalline ceramic and has a Young's modulus greater than or equal to 150 GPa. The carrier substrate has a coefficient of thermal expansion of greater than or equal to $20 \times 10^{-7}/°$ C. to less than or equal to $120 \times 10^{-7}/°$ C. over a range from 25° C. to 500° C.

28 Claims, 2 Drawing Sheets

(51) Int. Cl.
*H01L 21/683* (2006.01)
*B29C 65/00* (2006.01)
*B29C 70/72* (2006.01)
*H01L 23/367* (2006.01)
*H01L 23/498* (2006.01)

(52) U.S. Cl.
CPC ...... *H01L 21/6833* (2013.01); *H01L 21/6835* (2013.01); *H01L 21/6875* (2013.01); *H01L 21/68757* (2013.01); *H01L 23/367* (2013.01); *H01L 23/498* (2013.01)

(56) References Cited

U.S. PATENT DOCUMENTS

| | | | |
|---|---|---|---|
| 6,417,127 B1 | 7/2002 | Yamamoto et al. | |
| 8,859,103 B2 | 10/2014 | Canale et al. | |
| 9,227,295 B2 | 1/2016 | Markham et al. | |
| 9,287,106 B1 | 3/2016 | Miao et al. | |
| 9,390,955 B2 | 7/2016 | Takagaki et al. | |
| 2002/0005507 A1* | 1/2002 | Matsumoto | H01B 1/16 252/500 |
| 2004/0090266 A1* | 5/2004 | Sakai | H03F 1/0211 330/129 |
| 2008/0315351 A1* | 12/2008 | Kakehata | H01L 27/112 257/507 |
| 2009/0293647 A1 | 12/2009 | Muneishi et al. | |
| 2010/0056026 A1* | 3/2010 | Shirota | C09G 1/02 451/41 |
| 2012/0302063 A1 | 11/2012 | Markham et al. | |
| 2013/0213582 A1 | 8/2013 | Inao et al. | |
| 2013/0321973 A1 | 12/2013 | Wiltsche et al. | |
| 2015/0099330 A1 | 4/2015 | Canale et al. | |
| 2015/0364548 A1 | 12/2015 | Miyazawa et al. | |
| 2016/0046528 A1 | 2/2016 | Miyazawa et al. | |
| 2016/0087152 A1 | 3/2016 | Sheen | |
| 2016/0185521 A1 | 6/2016 | Lecocq et al. | |

FOREIGN PATENT DOCUMENTS

| | | |
|---|---|---|
| EP | 1359469 A1 | 11/2003 |
| WO | 2009032197 A1 | 3/2009 |

OTHER PUBLICATIONS

International Search Report and Written Opinion PCT/US2017/039397 dated Sep. 14, 2017.

Li et al. "Composite YAG/Nd:YAG transparent ceramics for high-power lasers" Shanghai Institute of Ceramics, Proc of SPIE vol. 8206, 2012. pp. 1-6.

Thomas et al. "Optical properties of Nd doped and undoped polycrystalline YAG" SPIE 6545, 2007, pp. 1-8.

* cited by examiner

CARRIER SUBSTRATES FOR SEMICONDUCTOR PROCESSING

CROSS-REFERENCE TO RELATED APPLICATIONS

This application claims the benefit of priority under 35 U.S.C. § 119 of U.S. Provisional Application Ser. No. 62/357,520 filed on Jul. 1, 2016, the content of which is relied upon and incorporated herein by reference in its entirety.

BACKGROUND

Field

The present specification generally relates to carrier substrates for semiconductor processing and, more particularly, to carrier substrates comprising a stiff base layer and an optional glass layer.

Technical Background

Substrates may be used as carriers for silicon semiconductors for the production of integrated circuits. Silicon semiconductors are disposed on the substrates and then back-grinded to a desired thickness and/or chips may be assembled to the silicon semiconductors. During semiconductor back-grinding, the thickness of the silicon semiconductor is reduced to allow for stacking and high density packaging of integrated circuits. While making such integrated circuits, it may be important that the semiconductor is not distorted by the back-grinding or by a mismatch in the coefficient of thermal expansion (CTE) between the wafer or panel and the metallized layers during processing.

Current approaches to this problem include glass and metal stiffeners that are attached to the back of non-electrically active side of the semiconductor to minimize distortions during processing. However, there may be limitations to both of these approaches. In the case of glass stiffeners, the stiffness of the material is not adequate to ensure the flatness of the substrate in all processing steps and is prone to damage in handling. However, glass is advantageous because its transparency allows for easier laser debonding of the stiffener, and because different glass compositions may be used to match the CTE of the glass carrier substrate to the CTE of the semiconductor. Metal stiffeners have better damage resistance than glass stiffeners, but their stiffness is not as high as glass stiffeners and metal stiffeners may be more prone to corrosive attack in acid etch baths. Additionally, metal stiffeners do not lend themselves well to the laser debonding process because they are non-translucent. Methods of debonding through non-laser means, such as heat convection, are possible but drive equipment and processing changes in an industry where such equipment changes are costly.

Accordingly, a need exists for alternative substrates that can be used as carriers for wafer and panel level processing of silicon semiconductors, with a designed and specified coefficient of thermal expansion.

SUMMARY

According to one embodiment, a carrier substrate includes a base layer having a first surface, and having a second surface that is parallel to and opposite of the first surface. The carrier substrate further includes a glass layer bonded to the first surface of the base layer. The carrier substrate has a Young's modulus from greater than or equal to 150 GPa.

In another embodiment, a carrier substrate includes a base layer having a first surface, and having a second surface that is parallel to and opposite of the first surface. The carrier substrate further includes a glass layer bonded to the first surface of the base layer and a glass layer bonded to the second surface of the base layer. The carrier substrate has a Young's modulus from greater than or equal to 150 GPa.

In another embodiment, a carrier substrate includes a polycrystalline ceramic and has a Young's modulus of greater than or equal to 150 GPa. The carrier substrate has a coefficient of thermal expansion of greater than or equal to $20 \times 10^{-7}/°$ C. to less than or equal to $120 \times 10^{-7}/°$ C. over a range from 25° C. to 500° C.

In another embodiment, a carrier substrate includes a polycrystalline ceramic base layer having a first surface, and having a second surface that is parallel to and opposite of the first surface. The carrier substrate further includes a glass layer bonded to the first surface of the base layer. The carrier substrate has a Young's modulus of greater than or equal to 150 GPa, and a coefficient of thermal expansion of greater than or equal to $20 \times 10^{-7}/°$ C. to less than or equal to $120 \times 10^{-7}/°$ C. over a range from 25° C. to 500° C.

In another embodiment, a carrier substrate includes a polycrystalline ceramic base layer having a first surface, and having a second surface that is parallel to and opposite of the first surface. The carrier substrate further includes a glass layer bonded to the first surface of the base layer and a second glass layer bonded to the second surface of the base layer. The carrier substrate has a Young's modulus of greater than or equal to 150 GPa, and a coefficient of thermal expansion of greater than or equal to $20 \times 10^{-7}/°$ C. to less than or equal to $120 \times 10^{-7}/°$ C. over a range from 25° C. to 500° C.

Additional features and advantages of the apparatuses for semiconductor carriers described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
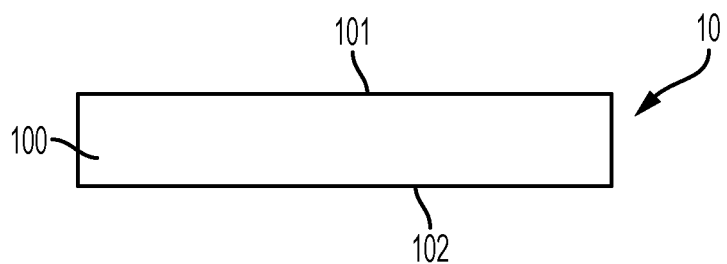
FIG. 1 schematically depicts a carrier substrate base layer, according to one or more embodiments shown and described herein.

Reference will now be made in detail to carrier substrates for semiconductors, examples of which are illustrated in the accompanying drawings. Whenever possible the same reference numerals will be used throughout the drawings to refer to the same or like parts. Embodiments of carrier substrates disclosed herein include a base layer that provides stiffness to the carrier substrate that reduces deformation of the semiconductor during processing. In some embodiments, the semiconductor may be applied directly to the base layer. For instance, the high stiffness of the base layer can compensate for a CTE mismatch between the carrier wafer and the semiconductor. However, in some instances, the base layer may be comprised of a material that makes it difficult or costly to machine the base layer of the carrier substrate to have a surface roughness ($R_a$) that will allow a semiconductor to be bonded directly to the base layer. Embodiments of carrier substrates disclosed herein address this and other difficulties—such as difficulty in CTE matching to the semiconductor—by bonding a glass layer to a surface of the base layer with a high stiffness. In such embodiments, the glass layer may be machined to have a surface roughness ($R_a$) that permits a semiconductor to be applied to a surface of the glass layer.

Referring to FIG. 1, an exemplary carrier substrate 10 according to embodiments is depicted. The carrier substrate 10 depicted in FIG. 1 comprises a base layer 100 that has a first surface 101 and a second surface 102 that is parallel to and opposite of the first surface 101. The base layer 100 provides stiffness to the carrier substrate 10 such that deformation of the semiconductor is reduced during processing and handling of the semiconductor.

In embodiments, such as those depicted in FIG. 1, the carrier substrate 10 may be comprised of the base layer 100. In such embodiments, the base layer 100 is comprised of a polycrystalline ceramic. Exemplary polycrystalline ceramics include alumina, zirconia, spinel, and other translucent polycrystalline ceramics. The polycrystalline ceramic base layer may be produced by a multitude of ceramic processing methods, such as, for example, tape casting, roller milling, and calendaring.

Figure 2:
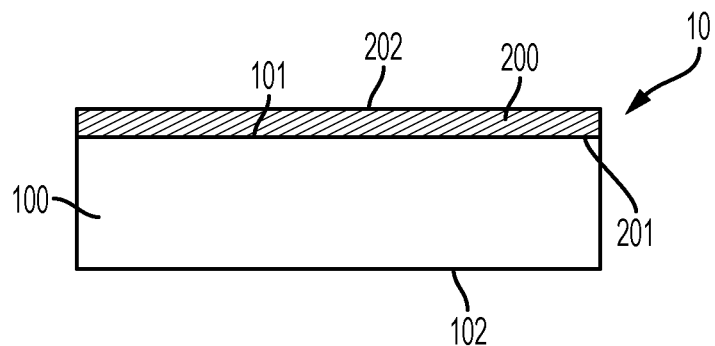
FIG. 2 schematically depicts a carrier substrate base layer having a glass layer bonded to a first surface of the base layer, according to one or more embodiments shown and described herein.

With reference now to FIG. 2, in embodiments, the carrier substrate 10 may comprise a base layer 100 and a glass layer 200 bonded to a first surface 101 of the base layer 100. The glass layer 200 has a first surface 201 and a second surface 202 parallel to and opposite of the first surface 201. The first surface 201 of the glass layer 200 is bonded to the first surface 101 of the base layer 100, such that the second surface 202 of the glass layer is exposed and can be machined. In embodiments, a semiconductor may be applied to the second surface 202 of the glass layer 200 after it is machined and after the glass layer 200 has been bonded to the base layer 100. The composition of the glass layer may be selected so that the CTE of the glass layer 200 matches the CTE of the base layer 100. In some embodiments, the glass may be an alkali aluminosilicate glass or an alkali-free aluminosilicate glass. In embodiments, the glass layer may be a glass sheet formed by various methods, such as, for example, drawing, down drawing, fusion drawing, overflow down drawing, float methods, and the like. In other embodiments, the glass may be formed by spray applications of frit compositions, glazing-type processes, and substrate dipping. As used herein, the term "glass" is meant to include any material made partially or wholly of glass, including glass and glass-ceramics. Glass-ceramics include glass in both an amorphous phase and a crystalline phase. In some embodiments, when the glass is a glass-ceramic, the average crystal size in the glass-ceramic is 100 angstroms or less, 90 angstroms or less, 80 angstroms or less, or 70 angstroms or less.

Figure 3:
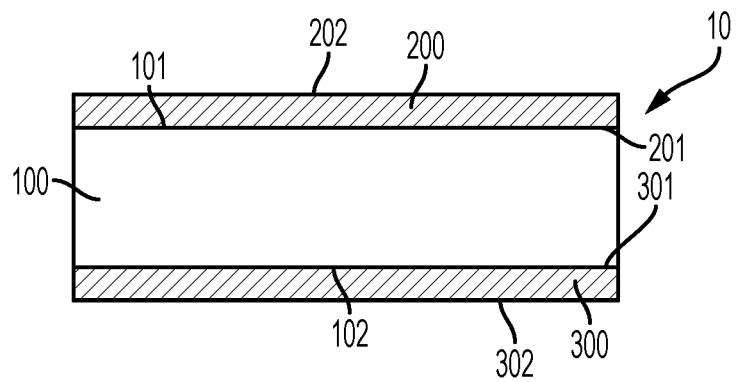
FIG. 3 schematically depicts a carrier substrate base layer having a first glass layer bonded to a first surface of the base layer and a second glass layer bonded to a second surface of the base layer, according to one or more embodiments shown and described herein.

With reference now to FIG. 3, in embodiments, the carrier substrate 10 may comprise a base layer 100, a glass layer 200 bonded to a first surface 101 of the base layer 100, and a second glass surface 300 bonded to a second surface 102 of the base layer 100. The second glass layer 300 has a first surface 301 and a second surface 302 parallel to and opposite of the first surface 301. The first surface 301 of the second glass layer 300 is bonded to the second surface 102 of the base layer 100, such that the second surface 302 of the second glass layer is exposed and can be machined. The composition of the second glass layer 300 may be selected so that the CTE of the glass layer 300 matches the CTE of the base layer 100 and/or matches the CTE of the glass layer 200. In some embodiments, the glass may be an alkali aluminosilicate glass or an alkali-free aluminosilicate glass. The glass composition of the second glass layer 300 may be the same or different from the composition of the glass layer 200. Application of a second glass layer 300 may be beneficial when there is a CTE mismatch between the glass layer 200 and the base layer 100. Adding the second glass layer 300 in these instances allow for more uniform flatness (e.g., reduction in bowing) by balancing the thermal expansion of the carrier substrate 10. In embodiments, the glass layer may be a glass sheet formed by various methods, such as, for example, drawing, down drawing, fusion drawing, overflow down drawing, float methods, and the like. In other embodiments, the glass may be formed by spray applications of frit compositions, glazing-type processes, and substrate dipping.

In embodiments where the carrier substrate 10 comprises a base layer 100 and one or more glass layer 200, 300—such as embodiments depicted in FIG. 2 and FIG. 3—the base layer may comprise any material that provides stiffness to the carrier substrate 10. In such embodiments, the base layer may comprise alumina, zirconia, sapphire, spinel, metals, and other translucent ceramics. In some embodiments, where the carrier substrate 10 comprises a base layer 100 and one or more glass layer 200, 300, the base layer may comprise a polycrystalline ceramic, such as, for example, alumina, zirconia, and spinel. In other embodiments, where the carrier substrate 10 comprises a base layer 100 and one or more glass layer 200, 300, the base layer may comprise a metal, such as, for example, stainless steel.

With reference now to FIG. 2 and FIG. 3, the glass layer 200 and the second glass layer 300 may be applied by any number of methods including direct bonding of the glass layer 200 or the second glass layer 300 to the base layer 100, or by indirectly bonding the glass layer 200 or the second glass layer 300 to the base layer 100.

In embodiments, the glass layer 200 may be directly bonded to the first surface 101 of the base layer 100 and/or the second glass layer 300 may be directly bonded to the second surface 102 of the base layer 100. According to embodiments, direct bonding of the glass layer 200 or the second glass layer 300 to the base layer 100 may be achieved by chemical/mechanical adhesion where the first surface 101 of the glass layer 200 and/or the first surface 301 of the second glass layer 300 is melted and then applied to either the first surface 101 and/or the second surface 102, respectively, of the base layer 100. This method has been shown to be effective when a CTE mismatch between the base layer 100 and either or both of the glass layer 200 and the second glass layer 300 is relatively small. In some embodiments, an annealing step is used in this process to minimize residual stresses. In some embodiments, one or more fluxing agents may be used to help facilitate the joining of the base layer 100 and one or both of the glass layer 200 and the second glass layer 300 by increasing the wetting and development of an interfacial reaction layer. An exemplary fluxing action uses a thin orthoboric acid layer applied between the base layer and one or both of the glass layer 200 and the second glass layer 300 prior to heating. The orthoboric acid provides a low temperature liquid phase to kick off melting reactions through the formation of eutectics, intermediate reaction products, and increased mobility of the species in the interfacial region. In embodiments, alkali and alkaline earth oxides can be used as fluxing agents. However, carbonates should be avoided because they generate gas during the decomposition of the carbonates to their associated oxides. This gas may drive undesirable bubble formation in the glass layer 200 of the second glass layer 300 that may cause issues in surface finishing. In embodiments, the direct bonding of the glass layer 200 and/or the second glass layer 300 to the base layer, as described herein above, should be undertaken in a vacuum atmosphere, to help minimize trapped air in the final glass layer.

Figure 4:
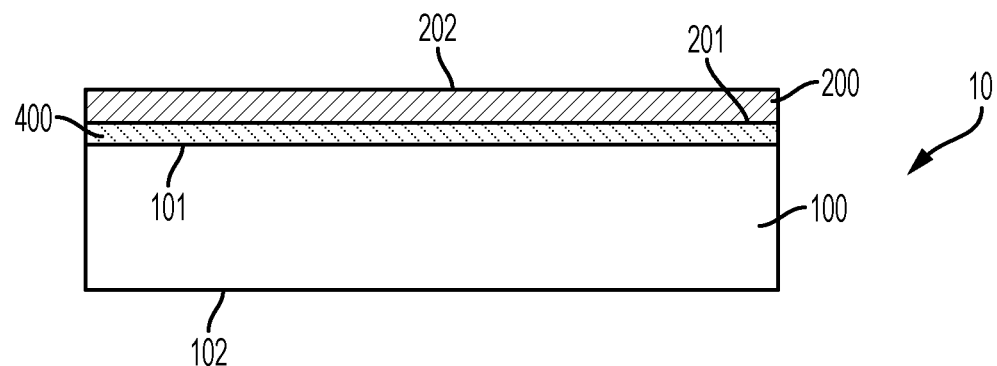
FIG. 4 schematically depicts a carrier substrate base layer having a glass layer bonded to a first surface of the base layer by an adhesive layer, according to one or more embodiments shown and described herein.
Figure 5:
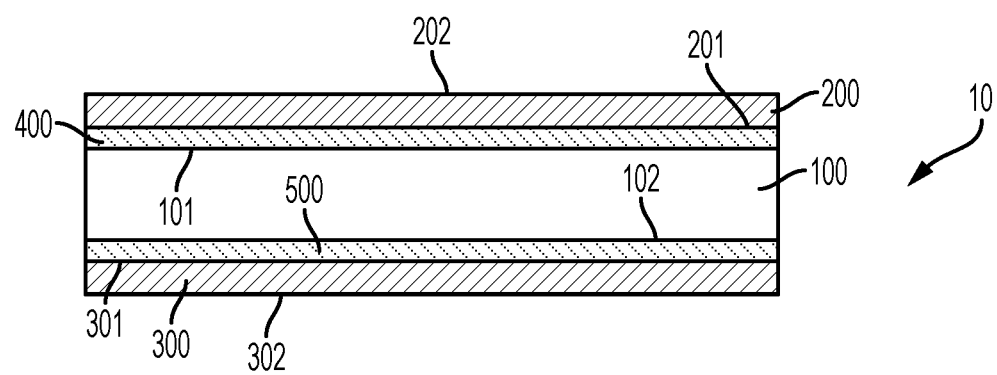
FIG. 5 schematically depicts a carrier substrate base layer having a first glass layer bonded to a first surface of the base layer by an adhesive layer and a second glass layer bonded to a second surface of the base layer by an adhesive layer, according to one or more embodiments shown and described herein.

With reference now to FIG. 4 and FIG. 5, an adhesive layer 400 is provided between the first surface 101 of the base layer 100 and the first surface 201 of the glass layer 200. Optionally, an adhesive layer 500 may be provided between the second surface 102 of the base layer 100 and the first surface 301 of the second glass layer 300. Using an adhesive layer may be an attractive option where one or both of the glass layer 200 and the second glass layer 300 is a flat display-type glass, such as those produced by drawing or fusion processes. In embodiments where an adhesive layer 400, 500 is used, neither the glass layer 200 nor the second glass layer 300 need to be melted to bond to the base layer. Therefore, the second surface 202 of the glass layer 200 and the second surface 302 of the second glass layer 300 remains flat and does not distort due to surface tension that occurs at high temperatures. In this almost pristine state the second surface 202 of the glass layer 200 and the second surface 302 of the second glass layer 300 require less polishing to meet surface finishing and dimensional tolerances of the final product.

Selecting an adhesive layer 400, 500 to provide between the base layer 100 and one or both of the glass layer 200 and the second glass layer 300, respectively, is important. The adhesive layer 400, 500 needs to not only to provide adequate strength to bond the glass layer 200 and/or the second glass layer 300 to the base layer and endure final polishing, but the adhesive layer 400, 500 also should survive the thermal debonding of the carrier substrate 10 from the semiconductor once processing is complete. A hierarchical approach to debonding temperatures between these two adhesive layer types is necessary. One way of achieving this hierarchical layering is by using lower temperature thermoplastic materials for bonding the carrier substrate 10 the semiconductor and a higher temperature thermoset polymer for bonding the base layer to one or both of the glass layer 200 and the second glass layer 300.

In some embodiments, where the base layer 100 is a ceramic, mechanical features may be added to one or both of the first surface 101 and the second surface 102 of the base layer 100 through thermal/mechanical embossing one or both of the first surface 101 and the second surface 102 of the base layer 100 in a green state and subsequent firing to the final base layer 100. In embodiments, methods of such surface alteration promote an amenable surface for bonding the base layer 100 to one or both of the glass layer 200 and the second glass layer 300. An exemplary method for altering one or both of the first surface 101 and the second surface 102 of the base layer 100 include surface roughening via sand blasting, embossing of a green ceramic base layer or other methods of the like. These surface alterations give the glass layer/adhesive layer an agreeable surface on which to bond and offers an increase in the surface area of bonding for the glass/adhesive over that of a totally flat ceramic substrate.

The dimensions and geometry of a carrier substrate—such as, for example, carrier substrate 10 depicted in FIGS. 1-5—are not particularly limited. In embodiments, the geometry of a carrier substrate may be circular, elliptical, rectangular, or square. In embodiments where the geometry of the carrier substrate is circular or elliptical, the diameter of the carrier substrate may be greater than or equal to 200 mm to less than or equal to 300 mm. In some embodiments where the geometry of the carrier substrate is circular or elliptical, the diameter of the carrier substrate may be about 200 mm. In other embodiments where the geometry of the carrier substrate is circular or elliptical, the diameter of the carrier substrate may be about 300 mm. It should be understood that in embodiments where the carrier substrate is elliptical, the diameter referred to above is largest diameter of the ellipse. In embodiments where the carrier substrate has a rectangular or square geometry, the carrier substrate may have a length that is less than or equal to 750 mm and a width that is less than or equal to 750 mm. In some embodiments where the carrier substrate has a rectangular or square geometry, the carrier substrate may have a length that is greater than or equal to 250 mm and less than or equal to 750 mm and a width that is greater than or equal to 250 mm and less than or equal to 750 mm, such as a length that is greater than or equal to 350 mm and less than or equal to 650 mm and a width that is greater than or equal to 250 mm and less than or equal to 650 mm.

The carrier substrates disclosed herein, which comprise a base layer 100, optional glass layers 200, 300, and optional adhesive layers 400, 500, have thicknesses according to the materials used in the layers and in according to processing of the semiconductor that is to be applied to the carrier substrate. In embodiments, the thickness of the carrier substrate may be from greater than or equal to 0.15 mm to less than or equal to 3.00 mm, such as from greater than or equal to 0.25 mm to less than or equal to 2.75 mm. In other embodiments, the thickness of the carrier substrate may be from greater than or equal to 0.50 mm to less than or equal to 2.50 mm, such as from greater than or equal to 0.75 mm to less than or equal to 2.25 mm. In other embodiments, the thickness of the carrier substrate may be from greater than or equal to 1.00 mm to less than or equal to 2.00 mm, such as from greater than or equal to 1.25 mm to less than or equal to 1.75 mm.

In some embodiments, it may be advantageous to have a relatively planar carrier substrate. As used herein "planarity" refers to the flatness of the carrier substrate. The planarity may be measured by the distortion of the carrier substrate along a dimension. For instance, a carrier substrate with a bow or "U" shape may have a maximum height at either end of the carrier substrate along its length and a minimum height near the geometrical middle of its length. The "planarity" of the carrier substrate is the difference between the maximum height and a minimum height. Accordingly, as a further example, a carrier substrate having a bow or "U" shape may have a maximum height of 30 μm and a minimum height of 5 μm, which would yield a planarity of 25 μm. Carrier substrates according to embodiments disclosed herein may have a planarity of less than or equal to 25 μm, such as less than or equal to 20 μm. In other embodiments, carrier substrates may have a planarity of less than or equal to 15 μm, such as less than or equal to 10 μm. In still other embodiments, carrier substrates may have a planarity of less than or equal to 5 μm, such as less than or equal to 2 μm. In yet other embodiments, carrier substrates may have a planarity of less than or equal to 1 μm, such as less than or equal to 0.5 μm. As used herein, the term planarity is defined as a sum of the absolute values of the maximum distances which are respectively measured between a highest point and a least squares focal plane applied to a shape of the glass-based article 100 and a lowest point and the least squares focal plane. The highest point and the lowest point are both with respect to the same surface of the glass-based article 100. The least squares focal plane is applied to the shape of the unclamped (free state) glass-based article. The least squares focal plane is determined by the following method. A plane is determined by the equation $z=A+Bx-Cy$. Then, the least squares planar fit is determined through matrix minimization of the sum of the squares of the deviations of the real data from the plane. This method finds the least squares values A, B, and C. The matrices are determined as follows:

$$\begin{bmatrix} n & \sum x_j & \sum y_j \\ \sum x_j & \sum x_j^2 & \sum x_j * y_j \\ \sum y_j & \sum x_j * y_j & \sum y_j^2 \end{bmatrix} * \begin{bmatrix} A \\ B \\ C \end{bmatrix} =$$

By solving this equation for A, B, and C, the least squares fit is complete. The planarity may be measured using a Tropel FlatMaster MSP (Multi-Surface Profiler).

To provide a surface that is amenable to applying a semiconductor, or to provide a surface that is amenable to processing equipment, such as, for example, a vacuum chuck, the surface of the carrier substrate on which the semiconductor is to be applied, and/or the surface of the carrier substrate that is to be used with processing equipment may have an appropriate surface roughness ($R_a$). The roughness of such a surface may be a result of the way the surface is formed. For instance, where such a surface is a second surface 202 of the glass layer 200 or the second surface 302 of the second glass layer, the surface roughness may be a result of the way the glass layer is formed, such as, for example, by fusion processes, which yield glass surfaces with very low surface roughness ($R_a$). For surfaces that are not formed with the desired surface roughness ($R_a$), such as, for example the first surface 101 and the second surface 102 of the base layer 100, the surface may be machined, such as, for example, by conventional grinding and polishing techniques, to have the desired surface roughness. To this end, it is generally easier and more cost effective to machine a glass layer to have a desired surface roughness ($R_a$) than it is to machine a ceramic layer to have a desired surface roughness ($R_a$). In embodiments, a surface of carrier substrate may have a surface roughness ($R_a$) of less than or equal to 30 nm, such as less than or equal to 25 nm. In other embodiments, a surface of carrier substrate may have a surface roughness ($R_a$) of less than or equal to 20 nm, such as less than or equal to 15 nm. In yet other embodiments, a surface of carrier substrate may have a surface roughness ($R_a$) of less than or equal to 10 nm, such as less than or equal to 5 nm. The surface roughness ($R_a$) may be measured using a surface profilometer available from Zygo where the surface roughness ($R_a$) in at least three sample areas of about 100 μm by 100 μm are measured and averaged.

As referred to hereinabove, the base layer of the carrier substrate provides stiffness to the carrier substrate. Increased stiffness of the carrier substrate may lead to reduced distortion of the semiconductor during processing because the carrier substrate is less likely to deform during the process. In addition, having a carrier substrate with high stiffness minimizes the effects of a CTE mismatch between the layers of the carrier substrate, and a CTE mismatch between the carrier substrate and the semiconductor by decreasing the amount of deformation of the carrier substrate that results from expansion and contraction during thermal processes. To this end, in embodiments, the carrier substrate has a Young's modulus greater than 150 GPa, such as from greater than or equal to 150 GPa to less than or equal to 400 GPa, or from greater than or equal to 200 GPa to less than or equal to 380 GPa. In other embodiments, the carrier substrate has a Young's modulus from greater than or equal to 250 GPa to less than or equal to 350 GPa, such as from 275 GPa to greater than or equal to 325 GPa. The Young's modulus value recited in this disclosure refers to a value as measured by a sonic resonance technique at room temperature of the general type set forth in ASTM E1875-13 titled "Standard test method for dynamic Young's modulus, shear modulus, and Poisson's ration by sonic resonance". It should be understood that in embodiments where the carrier substrate comprises a base layer only, the Young's modulus disclosed above is the Young's modulus of the base layer. However, in embodiments where the carrier substrate comprises a base layer, one or more glass layers, and one or more adhesive layers, the Young's modulus disclosed above is the Young's modulus of the entire carrier substrate including the base layer and any glass layers or adhesive layers.

As disclosed hereinabove, during a process of manufacturing semiconductors, it has been found that in embodiments, the CTE of carrier substrates may be the same, or substantially the same, as the CTE of the semiconductor substrate to reduce deformation. This ensures similar amounts of expansion between the semiconductor and the carrier substrate laminate when the semiconductor is subject to heat processes, such as solder reflow processes, and thereby prevents mechanical failure of the semiconductor due to thermally imposed stresses. In embodiments, the CTE of the base layer is the same, or substantially the same, as the CTE of the substrate. In such embodiments, the semiconductor may be applied directly to the base layer of the carrier substrate without the addition of a glass layer. However, in other embodiments, the CTE of the base layer does not match the CTE of the semiconductor. In such embodiments a glass layer is bonded to at least one surface of the base layer—as depicted, for example, in FIG. 2—and the glass layer has a CTE that is the same or substantially the same as the CTE of the semiconductor. In such embodiments, the semiconductor is applied to the glass layer with the same, or substantially the same, CTE. However, using a base layer with high stiffness compensates for deformation caused by a CTE mismatch between the layer of the carrier substrate on which the semiconductor is applied and the CTE of the semiconductor. Thus, in embodiments, the CTE of the layer of the carrier substrate on which the semiconductor is applied need not match, or substantially match, the CTE of the semiconductor. It should be understood that as used in this paragraph, "substantially the same" CTE means the target CTE±10%.

In embodiments the layer of the carrier substrate to which the semiconductor is applied, such as a base layer or a glass layer, has a CTE of greater than or equal to $20 \times 10^{-7}/°$ C. to less than or equal to $120 \times 10^{-7}/°$ C. over a range from 25° C. to 500° C., such as from greater than or equal to $30 \times 10^{-7}/°$ C. to less than or equal to $90 \times 10^{-7}/°$ C. over a range from 25° C. to 500° C. In embodiments, the layer of the carrier substrate to which the semiconductor is applied, such as a base layer or a glass layer, has a CTE of greater than or equal to $40 \times 10^{-7}/°$ C. to less than or equal to $85 \times 10^{-7}/°$ C. over a range from 25° C. to 500° C., such as from of greater than or equal to $50 \times 10^{-7}/°$ C. to less than or equal to $80 \times 10^{-7}/°$ C. over a range from 25° C. to 500° C. In embodiments, the layer of the carrier substrate to which the semiconductor is applied, such as a base layer or a glass layer, has a CTE of greater than or equal to $70 \times 10^{-7}/°$ C. to less than or equal to $78 \times 10^{-7}/°$ C. over a range from 25° C. to 500° C., such as from of greater than or equal to $71 \times 10^{-7}/°$ C. to less than or equal to $77 \times 10^{-7}/°$ C. over a range from 25° C. to 500° C. The CTE may be measured using a push-rod dilatometer in accordance with ASTM E228-11.

In embodiments, it may be advantageous to debond the carrier substrate from the semiconductor using laser debonding. In such embodiments, the carrier substrate should be translucent to ultraviolet (UV) and/or infrared (IR) light depending on the irradiating laser. Because the glass layers are generally translucent to all light, the limiting component in the transmission of UV and IR light is generally the base layer. In embodiments, the carrier substrate has a transmission from greater than or equal to 30% to less than or equal to 90% at a wavelength of approximately 1 µm, greater than or equal to 30% to less than or equal to 85% at a wavelength of approximately 1 µm, greater than or equal to 30% to less than or equal to 80% at a wavelength of approximately 1 µm, greater than or equal to 30% to less than or equal to 75% at a wavelength of approximately 1 µm, greater than or equal to 30% to less than or equal to 70% at a wavelength of approximately 1 µm, greater than or equal to 40% to less than or equal to 90% at a wavelength of approximately 1 µm, greater than or equal to 40% to less than or equal to 85% at a wavelength of approximately 1 µm, greater than or equal to 40% to less than or equal to 80% at a wavelength of approximately 1 µm, greater than or equal to 40% to less than or equal to 75% at a wavelength of approximately 1 µm, greater than or equal to 40% to less than or equal to 70% at a wavelength of approximately 1 µm, greater than or equal to 50% to less than or equal to 90% at a wavelength of approximately 1 µm, greater than or equal to 50% to less than or equal to 85% at a wavelength of approximately 1 µm, greater than or equal to 50% to less than or equal to 80% at a wavelength of approximately 1 µm, greater than or equal to 50% to less than or equal to 75% at a wavelength of approximately 1 µm, greater than or equal to 50% to less than or equal to 70% at a wavelength of approximately 1 µm, greater than or equal to 55% to less than or equal to 90% at a wavelength of approximately 1 µm, greater than or equal to 55% to less than or equal to 85% at a wavelength of approximately 1 µm, greater than or equal to 55% to less than or equal to 80% at a wavelength of approximately 1 µm, greater than or equal to 55% to less than or equal to 75% at a wavelength of approximately 1 µm, greater than or equal to 60% to less than or equal to 90% at a wavelength of approximately 1 µm, greater than or equal to 60% to less than or equal to 85% at a wavelength of approximately 1 µm, greater than or equal to 60% to less than or equal to 80% at a wavelength of approximately 1 µm, greater than or equal to 65% to less than or equal to 90% at a wavelength of approximately 1 µm, greater than or equal to 65% to less than or equal to 85% at a wavelength of approximately 1 µm, greater than or equal to 70% to less than or equal to 90% at a wavelength of approximately 1 µm, or any ranges and sub-ranges therein.

It should now be understood that in embodiments a carrier substrate includes a base layer having a first surface, and having a second surface that is parallel to and opposite of the first surface. The carrier substrate further includes a glass layer bonded to the first surface of the base layer. The carrier substrate has a Young's modulus greater than or equal to 150 GPa. It should also now be understood that in embodiments a carrier substrate includes a polycrystalline ceramic and has a Young's modulus of greater than or equal to 150 GPa to less than or equal to 400 GPa. The carrier substrate has a coefficient of thermal expansion of greater than or equal to $20 \times 10^{-7}/°$ C. to less than or equal to $120 \times 10^{-7}/°$ C. over a range from 25° C. to 500° C.

In a first aspect, a carrier substrate comprises: a base layer having a first surface, and having a second surface that is opposite of the first surface; and a glass layer bonded to the first surface of the base layer, wherein the carrier substrate has a Young's modulus greater than or equal to 150 GPa and a transmission from greater than or equal to 60% to less than or equal to 90% at a wavelength of approximately 1 µm.

In a second aspect, a carrier substrate of the first aspect has a coefficient of thermal expansion from greater than or equal to $20 \times 10^{-7}/°$ C. to less than or equal to $120 \times 10^{-7}/°$ C. over a temperature range from 25° C. to 500° C.

In a third aspect, a carrier substrate of the first and second aspects has a coefficient of thermal expansion from greater than or equal to $30 \times 10^{-7}/°$ C. to less than or equal to $90 \times 10^{-7}/°$ C. over a temperature range from 25° C. to 500° C.

In a fourth aspect, a carrier substrate of any of the first through third aspect has a Young's modulus of greater than or equal to 150 GPa to less than or equal to 400 GPa.

In a fifth aspect, a carrier substrate of any of the first through fourth aspects has a Young's modulus of greater than or equal to 200 GPa to less than or equal to 380 GPa.

In a sixth aspect, a carrier substrate of any of the first through fifth aspects has a transmission from greater than or equal to 65% to less than or equal to 90% at a wavelength of approximately 1 µm.

In a seventh aspect, a carrier substrate of any of the first through sixth aspects has a transmission from greater than or equal to 70% to less than or equal to 90% at a wavelength of approximately 1 µm.

In an eighth aspect, a carrier substrate of any of the first through seventh aspects has a planarity of less than or equal to 25 µm.

In a ninth aspect, a carrier substrate of any of the first through eighth aspects has a first surface, and has a second surface that is parallel to and opposite of the first surface, the first surface of the glass layer is bonded to the first surface of the base layer, and the second surface of the glass layer has a surface roughness (Ra) of less than or equal to 30 nm.

In a tenth aspect, a carrier substrate of any of the first through ninth aspects, has a base layer comprising a material selected from the group consisting of alumina, zirconia, sapphire, spinel, other high stiffness ceramic materials, and metals.

In an eleventh aspect, a carrier substrate of any of the first through tenth aspects has a base layer comprising a polycrystalline ceramic.

In a twelfth aspect, a carrier substrate of any of the first through eleventh aspects has a base layer comprising a material selected from the group consisting of alumina, zirconia, and spinel.

In a thirteenth aspect, a carrier substrate of any of the first through tenth aspects has a base layer comprising a metal.

In a fourteenth aspect, a carrier substrate of any of the first through thirteenth aspects has a circular geometry and has a diameter from greater than or equal to 200 mm to less than or equal to 300 mm.

In a fifteenth aspect, a carrier substrate of any of the first through thirteenth aspects has a rectangular geometry with a width that less than or equal to 750 inches and a length that is less than or equal to 750 mm.

In a sixteenth aspect, a carrier substrate of any of the first through fifteenth aspects has a second glass layer is bonded to the second surface of the base layer.

In a seventeenth aspect, a carrier substrate of any of the first through fifth aspects has the glass layer bonded to the first surface of the base layer by an adhesive layer that is positioned between and in contact with the glass layer and the first surface of the base layer.

In an eighteenth aspect, a carrier substrate of the seventeenth aspect has a second glass layer bonded to the second surface of the base layer by a second adhesive layer that is positioned between and in contact with the second glass layer and the second surface of the base layer.

In a nineteenth aspect, a carrier substrate comprises a polycrystalline ceramic, wherein the carrier substrate has a Young's modulus greater than or equal to 150 GPa, the carrier substrate has a coefficient of thermal expansion of greater than or equal to $20 \times 10^{-7}/°$ C. to less than or equal to $120 \times 10^{-7}/°$ C. over a range from 25° C. to 500° C., and the carrier substrate has a transmission from greater than or equal to 30% to less than or equal to 90% at a wavelength of approximately 1 μm.

In a twentieth aspect, a carrier substrate of the nineteenth aspect has a Young's modulus of greater than or equal to 150 GPa to less than or equal to 400 GPa.

In a twenty-first aspect, a carrier substrate of the nineteenth and twentieth aspects has a Young's Modulus of greater than or equal to 200 GPa to less than or equal to 380 GPa.

In a twenty-second aspect, a carrier substrate of any of the nineteenth through twenty-first aspects has a coefficient of thermal expansion of greater than or equal to $30 \times 10^{-7}/°$ C. to less than or equal to $90 \times 10^{-7}/°$ C. 25° C. to 300° C. over a temperature range from 25° C. to 500° C.

In a twenty-third aspect, a carrier substrate of any of the nineteenth through twenty-second aspects has a transmission from greater than or equal to 60% to less than or equal to 90% at a wavelength of approximately 1 μm.

In a twenty-fourth aspect, a carrier substrate of any of the nineteenth through twenty-third aspects has a transmission from greater than or equal to 65% to less than or equal to 90% at a wavelength of approximately 1 μm.

In a twenty-fifth aspect, a carrier substrate of any of the nineteenth through twenty-fourth aspects has a planarity of less than or equal to 25 μm.

In a twenty-sixth aspect, a carrier substrate of any of the nineteenth through twenty-fifth aspects has at least one surface having a surface roughness ($R_a$) less than or equal to 30 nm.

In a twenty-seventh aspect, a carrier substrate of any of the nineteenth through twenty-sixth aspects has a polycrystalline ceramic selected from the group consisting of alumina, zirconia, spinel and other high stiffness ceramic materials.

In a twenty-eighth aspect, a carrier substrate of any of the nineteenth through twenty-seventh aspects comprises: a base layer having a first surface, and having a second surface that is opposite of the first surface; and a glass layer bonded to the first surface of the base layer.

In a twenty-ninth aspect, a carrier substrate of the twenty-eighth aspect further comprises a second glass layer bonded to the second surface of the base layer.

EXAMPLES

Example 1

Translucent alumina was produced using the tape casting method described in U.S. Pat. No. 9,287,106 B1. The optical requirements, in terms of percent translucency, are not as stringent as in a purely optical application; therefore, sample formed herein did not use the hydrogen firing described in U.S. Pat. No. 9,287,106 B 1, but was sintered in air. A 152.4 mm polycrystalline alumina plate with a nominal thickness of 1.5 mm was formed that exhibited visible light translucency. When thinned down to the target thickness of 500-700 μm this layer provided the necessary stiffness to the composite structure when matched with a glass of comparable CTE. This demonstrates a size capability approaching 200 mm semiconductor wafers. The size in this case was limited by the tools producing the sample and not an intrinsic limit of the technology or inability to produce larger.

Example 2

A translucent alumina was produced in the method of U.S. Pat. No. 9,287,106 B1 and was joined via thermal processing to a piece of glass having a composition of 67.37 mol % $SiO_2$, 3.67 mol % $B_2O_3$, 12.73 mol % $Al_2O_3$, 13.77 mol % $Na_2O$, 0.01 mol % $K_2O$, 2.39 mol % MgO, 0.01 mol % $Fe_2O_3$, 0.01 mol % $ZrO_2$ and 0.09 mol % $SnO_2$, which had a CTE amenable to joining. Prior to joining the alumina substrate and glass were wiped down with ethyl alcohol to remove oils from handling. The alumina was placed on a piece of mullite kiln furniture and the glass was placed on top of the translucent alumina. The sample was joined at 1200° C. for a period of 30 minutes. after a 200° C./hr heating schedule in a Rapid Temperature Furnace manufactured by CM, Inc. This example demonstrates the joinability of the glass to the alumina ceramic while maintaining the translucent, or transparent, nature of the composite material. The mechanical polishing of this outer glass layer yielded a surface much easier to polish to the surface finish requirements for both roughness and parallelism than that of the pure ceramic.

Example 3

Production and subsequent joining of translucent zirconia was demonstrated. A tape cast method was used to form the surface. Due to the higher CTE of the zirconia ceramic, as compared to alumina ceramics, a higher CTE fusion drawn display glass was selected, in this case a glass having a composition of about 57.43 mol % $SiO_2$, 16.1 mol % $Al_2O_3$, 17.05 mol % $Na_2O$, 2.81 mol % MgO, 0.07 mol % $SnO_2$, 6.54 mol % $P_2O_5$. Prior to joining the zirconia substrate and glass were wiped down with ethyl alcohol to remove oils from handling. The zirconia was placed on a piece of mullite kiln furniture and the glass was placed on top of the translucent zirconia. The sample was joined at 1200° C. for a period of 30 minutes after a 200° C./hr heating schedule in a Rapid Temperature Furnace manufactured by CM, Inc. This example demonstrates the join-ability of the glass to the zirconia ceramic while maintaining the translucent nature of the composite material. The mechanical polishing of this outer glass layer yielded a surface much easier to polish to the surface finish requirements for both roughness and parallelism than that of the pure ceramic.

Example 4

The addition of surface features to the portion of the stiffening layer is another method of promoting interfacial adhesion between the outer clad glass and the ceramic. In this example, a texture was added in the green state to surface of the unfired ceramic via thermal/mechanical embossing. The surface was formed using a tape casting method. The fired ceramic in this case is a two phase mixture of ~75% alumina and 25% zirconia by volume. Due to the higher CTE of the alumina/zirconia ceramic a higher CTE fusion drawn display glass was selected, a glass having a composition of about 57.43 mol % $SiO_2$, 16.1 mol % $Al_2O_3$, 17.05 mol % $Na_2O$, 2.81 mol % MgO, 0.07 mol % $SnO_2$, 6.54 mol % $P_2O_5$.

Example 5

A glass sheet having of about 64.62 mol % $SiO_2$, 5.14 mol % $B_2O_3$, 13.97 mol % $Al_2O_3$, 13.79 mol % $Na_2O$, 2.4 mol % MgO, 0.003 mol % $TiO_2$, and 0.08 mol % $SnO_2$ was ground milled into a powder such that 50% of the particles had a diameter of about 5 μm. A paste was made from the powder, wherein the paste was about 22.22 wt % Texanol, 0.93 wt % T-100 EC, 75.93 wt % powder and 0.93 wt % OC-60. The paste was placed in a slot coat die to coat alumina substrate with a coating thickness of about 160 to 170 μm. The coated samples were heating in an oven at 60° C. for 2 hours to dry the coating. Then the coated samples were fired to sinter the glass in the coating on the alumina substrate using the following firing cycle. The coated substrates were heated at a rate of 5° C./min to 300° C., held at 300° C. for 1 hour, heated at a rate 5° C./min from 300° C. to 1100° C., held at 1100° C. for 2 hours and then cooled at a rate of 5° C./min to room temperature. After sintering the coating thickness was approximately 100 μm. This process resulted in a uniform glass coating layer on the alumina substrates.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

The invention claimed is:

1. A carrier substrate comprising:
   a base layer having a first surface, and having a second surface that is opposite of the first surface; and
   a glass layer bonded to the first surface of the base layer by an adhesive layer that is positioned between and in contact with the glass layer and the first surface of the base layer,
   wherein the carrier substrate has a Young's modulus greater than or equal to 150 GPa and a transmission from greater than or equal to 60% to less than or equal to 90% at a wavelength of approximately 1 μm.

2. The carrier substrate of claim 1, wherein the carrier substrate has a coefficient of thermal expansion from greater than or equal to $20 \times 10^{-7}$/° C. to less than or equal to $120 \times 10^{-7}$/° C. over a temperature range from 25° C. to 500° C.

3. The carrier substrate of claim 1, wherein the carrier substrate has a coefficient of thermal expansion from greater than or equal to $30 \times 10^{-7}$/° C. to less than or equal to $90 \times 10^{-7}$/° C. over a temperature range from 25° C. to 500° C.

4. The carrier substrate of claim 1, wherein the carrier substrate has a Young's modulus of greater than or equal to 150 GPa to less than or equal to 400 GPa.

5. The carrier substrate of claim 1, wherein the carrier substrate has a Young's modulus of greater than or equal to 200 GPa to less than or equal to 380 GPa.

6. The carrier substrate of claim 1, wherein the carrier substrate has a transmission from greater than or equal to 65% to less than or equal to 90% at a wavelength of approximately 1 μm.

7. The carrier substrate of claim 1, wherein the carrier substrate has a transmission from greater than or equal to 70% to less than or equal to 90% at a wavelength of approximately 1 μm.

8. The carrier substrate of claim 1, wherein the carrier substrate has a planarity of less than or equal to 25 μm.

9. The carrier substrate of claim 1, wherein the glass layer has a first surface, and has a second surface that is opposite of the first surface,
   the first surface of the glass layer is bonded to the first surface of the base layer, and
   the second surface of the glass layer has a surface roughness ($R_a$) of less than or equal to 30 nm.

10. The carrier substrate of claim 1, wherein the base layer comprises a material selected from the group consisting of alumina, zirconia, sapphire, spinel, and metals.

11. The carrier substrate of claim 1, wherein the base layer comprises a polycrystalline ceramic.

12. The carrier substrate of claim 10, wherein the base layer comprises a material selected from the group consisting of alumina, zirconia, and spinel.

13. The carrier substrate of claim 1, wherein the carrier substrate has a circular geometry and has a diameter from greater than or equal to 200 mm to less than or equal to 300 mm.

14. The carrier substrate of claim 1, wherein the carrier substrate has a rectangular geometry with a width that less than or equal to 750 mm and a length that is less than or equal to 750 mm.

15. The carrier substrate of claim 1, wherein a second glass layer is bonded to the second surface of the base layer.

16. The carrier substrate of claim 1, wherein a second glass layer is bonded to the second surface of the base layer by a second adhesive layer that is positioned between and in contact with the second glass layer and the second surface of the base layer.

17. The carrier substrate of claim 1, wherein the glass layer is an aluminosilicate glass layer.

18. A carrier substrate comprising:
a polycrystalline ceramic layer having a first surface and having a second surface that is opposite of the first surface, and
a glass layer bonded to the first surface of the polycrystalline ceramic layer by an adhesive layer that is positioned between and in contact with the glass layer and the first surface of the polycrystalline ceramic layer, wherein
the carrier substrate has a Young's modulus greater than or equal to 150 GPa,
the carrier substrate has a coefficient of thermal expansion of greater than or equal to $20 \times 10^{-7}$/° C. to less than or equal to $120 \times 10^{-7}$/° C. over a range from 25° C. to 500° C., and
the carrier substrate has a transmission from greater than or equal to 30% to less than or equal to 90% at a wavelength of approximately 1 μm.

19. The carrier substrate of claim 18, wherein the carrier substrate has a Young's modulus of greater than or equal to 150 GPa to less than or equal to 400 GPa.

20. The carrier substrate of claim 18, wherein the carrier substrate has a Young's Modulus of greater than or equal to 200 GPa to less than or equal to 380 GPa.

21. The carrier substrate of claim 18, wherein the carrier substrate has a coefficient of thermal expansion of greater than or equal to $30 \times 10^{-7}$/° C. to less than or equal to $90 \times 10^{-7}$/° C. over a temperature range from 25° C. to 500° C.

22. The carrier substrate of claim 18, wherein the carrier substrate has a transmission from greater than or equal to 60% to less than or equal to 90% at a wavelength of approximately 1 μm.

23. The carrier substrate of claim 18, wherein the carrier substrate has a transmission from greater than or equal to 65% to less than or equal to 90% at a wavelength of approximately 1 μm.

24. The carrier substrate of claim 18, wherein the carrier substrate has a planarity of less than or equal to 25 μm.

25. The carrier substrate of claim 18, wherein the carrier substrate has at least one surface having a surface roughness ($R_a$) less than or equal to 30 nm.

26. The carrier substrate of claim 18, wherein the polycrystalline ceramic is selected from the group consisting of alumina, zirconia, and spinel.

27. The carrier substrate of claim 18, wherein the carrier substrate further comprises a second glass layer bonded to the second surface of the polycrystalline ceramic layer.

28. The carrier substrate of claim 18, wherein the glass layer is an aluminosilicate glass layer.

\* \* \* \* \*